United States Patent [19]

Chang et al.

[11] 4,130,542
[45] Dec. 19, 1978

[54] POLYURETHANES STABILIZED AGAINST ULTRAVIOLET LIGHT AND NITROGEN OXIDE DETERIORATION

[75] Inventors: Eugene Y. C. Chang; Samuel Kaizerman, both of Bridgewater Township, Somerset County, N.J.

[73] Assignee: American Cyanamid Company, Stamford, Conn.

[21] Appl. No.: 690,126

[22] Filed: May 26, 1976

Related U.S. Application Data

[63] Continuation of Ser. No. 567,567, Apr. 14, 1975, abandoned, which is a continuation of Ser. No. 349,335, Apr. 9, 1973, abandoned.

[51] Int. Cl.$^2$ .......................... C08K 5/29; C08K 5/13; C08L 75/04
[52] U.S. Cl. .................. 260/45.9 KB; 260/29.2 TN; 260/45.8 NT; 260/45.85 T; 260/45.95 C; 260/45.95 H; 260/45.95 R; 528/67

[58] Field of Search .................. 260/75 NT, 77.5 AT, 260/77.5 SS, 45.9 KB

[56] References Cited

U.S. PATENT DOCUMENTS

| | | | |
|---|---|---|---|
| 3,444,843 | 5/1969 | Keberle et al. | 260/29.2 |
| 3,706,710 | 12/1972 | Camilleri et al. | 260/75 NT |
| 3,715,326 | 2/1973 | Traubel et al. | 260/2.5 AY |

*Primary Examiner*—H. S. Cockeram
*Attorney, Agent, or Firm*—Frank M. Van Riet

[57] ABSTRACT

A polyurethane polymer stabilized against the deteriorative effects of ultraviolet light and nitrogen oxides which comprises a polyurethane polymer and a stabilizing amount of an aliphatic or cycloaliphatic monoisocyanate or diisocyanate, said polyurethane polymer comprising an isocyanate terminated prepolymer obtained by reacting a polyether or a polyester with an excess of an aromatic diisocyanate, forming an emulsion thereof and subsequently chain-extending the prepolymer with water.

11 Claims, No Drawings

POLYURETHANES STABILIZED AGAINST ULTRAVIOLET LIGHT AND NITROGEN OXIDE DETERIORATION

This is a continuation, of application Ser. No. 567,567 filed Apr. 14, 1975 now abandoned, which, in turn, is a continuation of Ser. No. 349,335, filed Apr. 9, 1973, and now abandoned.

Generally stated, the subject matter of the present invention relates to stabilized polyurothanes. More particularly, the invention relates to polyurethanes stabilized aganist the degradative effects of ultraviolet light and nitrogen oxides.

BACKGROUND OF THE INVENTION

Polyurethanes obtained from isocyanate terminated prepolymers prepared by reacting aromatic diisocyantes with polyethers or polyesters are subject to deterioration when exposed to ultraviolet light or nitrogen oxide acid fumes. This deterioration is manifested by a discoloration of the polyurethane, usually yellow to brown. It is also particularly apparent in films prepared from polyether based polyurethanes chain extended with water. This discoloration is also noticed in polyurethanes prepared from polyesters, as well as in shaped articles such as fibers.

The discoloration due to ultraviolet light can be reduced by the addition to the polyurethane of an ultraviolet absorber; however, the ultraviolet absorber has little or no effect in protecting the polymer against nitrogen oxide acid fumes. The addition of a commonly used hindered phenol antioxidant will serve to reduce the deterioration due to nitrogen oxides; however, there is little to no effect in reducing ultraviolet light degradation. Combinations of ultraviolet absorber and antioxidant can and have been used successfully. Note U.S. Pat. No. 3,379,675, Jensen et al, wherein a combination of 2,2'-(o-hydroxyphenyl)benzotriazole and 1,3,5-trimethyl-2,4,6-tris(3,5-di-t-butyl-4-hydroxybenzyl)benzene is added to a polyether based spandex fiber. The combination is reported to produce a synergistic effect which is greater than that expected from the simple additive effects of the two types of stabilizers used separately. The above phenolic compound and 1,2,4,5-tertramethyl-3,6-bis(3,5-di-t-butyl-4-hydroxybenzyl) benzene are reported to stabilize polyether based spandex fibers against deterioration due to acid fumes; see U.S. Pat. No. 3,395,114, Smith.

The present invention represents the culmination of a long series of investigations conducted largely by the inventors directed to overcoming the inherent problems of ultraviolet and nitrogen oxide degradation of polyurethane polymers obtained from isocyanate prepolymers prepared by reacting polyethers or polyesters with aromatic diisocyanates.

Accordingly, it is the primary object of the present invention to provide a polyurethane polymer stabilized against the degradative effects of ultraviolet light and nitrogen oxides.

Another object of the invention is to provide a process for avoiding the deterioration of polyurethane polymers.

Generally then, it is an object of this invention to provide polyurethane polymers which are stable against ultraviolet and nitrogen oxide deterioration.

Additional objects and advantages of the invention will be set forth in part in the description which follows and in part will be obvious from the description, or may be realized by practice of the invention, the objects and advantages being realized and attained by means of the methods, processes, instrumentalities and combinations particularly pointed out in the appended claims.

THE INVENTION

To achieve the foregoing objects and in accordance with its purpose as embodied and broadly described, the present invention relates to a polyurethane polymer obtained from an isocyanate terminated prepolymer prepared by reacting a polyether or a polyester with an aromatic diisocyanate which comprises a stabilizing amount of an aliphatic or cycloaliphatic mono- or diisocyanate.

In addition, the invention also relates to a process for stabilizing polyurethanes obtained from isocyanate terminated prepolymers prepared by reacting a polyether or a polyester with an aromatic diisocyanate from the deterioration of nitrogen oxides and ultraviolet light which comprises adding a stabilizing amount of an aliphatic or cycloaliphatic monoor diisocyanate to the isocyanate terminated prepolymer.

It is to be understood that both the foregoing general description and the following detailed description are exemplary and explanatory and are not restrictive of the invention.

The prior art methods for stabilizing polyurethanes against ultraviolet light and acid fumes are described above. The present invention differs from prior art methods in that a high degree of stabilization toward ultraviolet light and acid fumes is obtained without the use of conventional ultraviolet absorbers and antioxidants. It also differs in that improvement is obtained in both ultraviolet and acid fume stability by the use of the isocyanate compound. Conventional ultraviolet absorbers and antioxidants may also be employed in the stabilization of the polyurethane and such utilization may afford additional stability; however, further improvement is not necessarily obtained, and the use of the ultraviolet absorbers and antioxidants is optional.

The polyurethanes stabilized according to the present invention can be either polyether or polyester based and be in the form of shaped articles such as films, fibers, compression molded or cast articles, coatings, extruded or injection molded articles, and the like. The beneficial effects of the invention, however, are most apparent in films, which includes coatings, produced from polyether based polyurethanes chain extended with water.

The hydroxyl terminated polyethers which may be used in the preparation of the polyurethanes of this invention are those derived from lower alkylene oxides and which have molecular weights in the range of from about 500 to 5,000 preferably 1,000 to 3,000. Typical of the useful polyethers are polyethylene glycol, polypropylene glycol, and polytetramethylene ether glycol particularly polypropylene glycol.

The polyesters which may be used are prepared according to known methods by the condensation of an aliphatic glycol, such as ethylene glycol, propylene glycol, 1,4-butandiol, hexamethylene glycol, and the like, with an aliphatic dicarboxylic acid or anhydride, such as succinic acid (or anhydride), adipic acid, pilmelic acid, sebacic acid, suberic acid, and the like. They are hydroxyl terminated and have molecular weights in the range from about 500 to 5,000. Mixtures of polyesters and polyethers may also be used.

The hydroxyl terminated polyether or polyester is converted by reaction with an excess of an aromatic diisocyanate into an isocyanate terminated polyurethane prepolymer. The prepolymers are made according to known methods using aromatic diisocyanates, such as 2,4-tolylene diisocyanate, 2,6-tolylene diisocyanate (and mixtures of the two isomers), p-phenylene diisocyanate, 4,4'-biphenylene diisocyanate, p,p'-methylene diphenyl diisocyanate, and the like.

In the preparation of the prepolymers, it is sometimes desirable to incorporate a small amount of a triol, in addition to the polyether or polyester, to provide cross linking sites. A suitable triol is trimethylol propane.

In the preferred embodiment of the invention, wherein the prepolymer is chain-extended with water, it is desirable to incorporate into the prepolymer an emulsifiable group, e.g. a carboxyl group. This may be introduced into the prepolymer by including in the total polyol a compound such as dihydroxymethyl propionic acid. The compound is incorporated into the prepolymer by virtue of the hydroxyl groups and the resulting prepolymer will contain pendant carboxyl groups. However, emulsifiable groups can be introduced into the prepolymer by any known means, such as those described in British Pat. No. 1,078,202. When such a prepolymer is contacted with water containing a salt forming compound, e.g. trimethylamine, the polymer is immediately emulsified. Thus, the chain-extended polymer is ready for use in film-forming as a stable latex. A latex may also be formed by contacting the prepolymer with water containing an emulsifying agent.

The aliphatic or cycloaliphatic mono- or diisocyanates useful as stabilizers include the n-alkyl isocyanates, such as ethyl isocyanate, n-butyl isocyanate, octyl isocyanate, stearyl isocyanate, and the like; alkylene diisocyanates, such as hexamethylene diisocyanate, and the like; cycloaliphatic mono isocyanates, such as cyclohexyl isocyanate, and substituted derivatives thereof, and cycloalkyl diisocyanates, such as methylene bis (cyclohexyl) isocyanate. Others include bis(2-isocyanato ethyl)fumarate, bis(2-isocyanato ethyl) carbonate, and the like.

The ultraviolet absorbers which may be used in combination with the above described aliphatic or cycloaliphatic mono- or diisocyanates includes:

A. 2-Hydroxybenzophenones: especially 2-hydroxybenzophenones with at least one additional substituent, for example 2-hydroxy-4-methoxybenzophenone; 2,4-dihydroxybenzophenone; 2,2'-dihydroxy-4-methoxybenzophenone; 2,2', 4,4'-tetrahydroxybenzophenone; 2,2'-dihydroxy-4,4'-dimethoxybenzophenone; 2-hydroxy-4-butoxybenzophenone; 2-hydroxy-4-octyloxybenzophenone, 2-hydroxy-4-dodecyloxybenzophenone, and the like. This type of ultraviolet absorber is described in U.S. Pat. No. 2,777,838 issued Jan. 15, 1967; U.S. Pat. No. 2,682,559 issued June 29, 1954; U.S. Pat. No. 2,693,492 issued Nov. 2, 1954; U.S. Pat. No. 2,861,053 issued Nov. 18, 1958; U.S. Pat. No. 2,919,259 issued Dec. 29, 1959; U.S. Pat. No. 2,976,259 issued Mar. 21, 1961; U.S. Pat. No. 3,006,959 issued Oct. 31, 1961; and U.S. Pat. No. 3,098,842 issued July 23, 1963.

B. Benzotriazols: especially the 2-(hydroxyphenyl)-benzotriazoles such as 2-(2-hydroxy-5-methylphenyl)-benzotriazole, 2-(2-hydroxy-5-octylphenyl)benzotriazole, 2-(2-hydroxy-4-methoxyphenyl)benzotriazole, 2-(2-hydroxy-3-t-butyl-5-methylphenyl)benzotriazole, 2-(2-hydroxy-3,5-di-t-butylphenyl)benzotriazole, 2-(2-hydroxy-3,5-di-t-amylphenyl)benzotriazole, 2-(2-hydroxy-3,5-di-t-butylphenyl)-5-chlorobenzotriazole, 2-(2-hydroxy-3-t-butyl-5-methyl-phenyl)-5-chlorobenzotriazole, and the like. This class of ultraviolet absorber is described in U.S. Pat. No. 3,004,896 issued Oct. 17, 1961; U.S. Pat. No. 3,018,269 issued Jan. 23, 1962; U.S. Pat. No. 3,271,339 issued Sept. 6, 1966.

C. Benzylidene-malonic esters: Diethyl-p-methoxybenzylidenemalonate, diethyl o-methoxybenzylidenemalonate, diethyl p-hydroxybenzylidenemalonate, diethyl diphenylmethylenemalonate, and the like. This class of ultraviolet absorbers is disclosed in U.S. application Ser. No. 389,210, filed Aug. 12, 1964. Additional ultraviolet absorbers of the class are also disclosed in U.S. Pat. No. 3,244,668 issued Apr. 5, 1966.

The phenolic antioxidants useful in combinations of this invention include e.g.: 2,6-di-t-butylphenol, 2,6-di-t-butyl-p-cresol, 2,2'-methylenebis(4-methyl-6-t-butylphenol), 2,2'-methylenebis(4-ethyl-6-t-butylphenol), 4,4'-butylidenebis (6-t-butyl-m-cresol), 4,4'-methylenebis(2,6-di-t-butylphenol), 4,4'-thiobis(6-t-butyl-o-cresol, 4,4'-thiobis(6-t-butyl-m-cresol), styrenated phenols and styrenated cresols, and the like.

The aliphatic or cycloaliphatic diisocyanate may be incorporated into the polymer in either of two ways. It may be added to the isocyanate terminated prepolymer prior to emulsification, or it can be added to the emulsion. The latter is accomplished by dissolving the isocyanate stabilizer in an inert, water immiscible solvent, such as chloroform, methylene chloride, toluene, or the like, and adding this solution to the emulsion and stirring in for 16–48 hours. The isocyanate stabilizer is used in an amount of from about 0.1 to 5 percent, based on the weight of solids in the emulsion, preferably from about 0.5 to 2 percent. However, the amount used to achieve the desired result will depend on the particular isocyanate selected.

In the preferred embodiment the latex is cast into 15–20 mil. films on glass plates and dried. The films are then tested according to Standard Test Method AATCC 16A-1964, Colorfastness to Light: Carbon - Arc Lamp, Continuous Light, using a Fade-Ometer; time of exposure 80 hours. The films are also exposed to acid fumes according to Standard Test Method AATCC 23-1962, Colorfastness to Oxides and Nitrogen in the Atmosphere, time of exposure 32 hours. The yellowness or Yellow Index of the samples after exposure is determined using the method identified as ASTM D-1925 with a Hunterlab Model D25 Color and Color Difference Meter. The relationship:

$$\text{Yellow Index} = 70(1 - \frac{\text{Blue}}{\text{Green}})$$

$$= 70(1 - R_{455}/R_{557})$$

where $R_{455}$ and $R_{557}$ represent the transmittance or reflectance at 455 m$\mu$ and 557 m$\mu$, respectively, is used.

The following examples are provided for illustrative purposes and may include particular features of the invention. However, the examples should not be construed as limiting the invention, many variations of which are possible without departing from the spirit or scope thereof. Unless otherwise indicated, all quantities given are on a weight or weight percent basis.

EXAMPLE I

Preparation of Polyurethane Prepolymer

Polypropylene glycol (Niax 2025, Mol. Wt. 2025, 2025 grams, 1.0 mole), was mixed with 26.8 grams (0.2 mole) of trimethylolpropane and 65 grams (0.48 mole) of dihydroxymethylpropionic acid and the mixture reacted with 497 grams (2.86 moles) of 80/20-tolylene diisocyanate for 18 hours at 70° C. The resulting polyurethane prepolymer containing pendant carboxyl groups had an NCO content of 4.05 percent.

EXAMPLE II

Preparation of Polyurethane Latex

A 100 gram sample of the prepolymer of Example I was poured into a high speed mixer (Waring Blender) containing 150 ml. of water and 2.8 ml. of triethylamine. The resulting emulsion, having a solids content of about 40 percent, was then transferred to a mechanically stirred vessel and the reaction continued for 16 hours at about 22° C. to complete the water extension reaction.

EXAMPLE III

Thin films were cast from the emulsion of Example II. The 15–20 mil films were exposed as described above and the Yellow Index measured using the Hunter Color and Color Difference Meter. A similar 3 samples of the emulsion were treated with 0.5 percent on the solid weight of the emulsion with methylenebis(4-cyclohexylisocyanate) by dissolving the isocyanate in an equal weight of (a) methylene chloride, (b) toluene and (c) $HCCl_3$ and mixing with the emulsion for 18 hours. Films were cast as described.

Table 1

|  |  | Gas Fade Test 32 hours | Fade-Ometer 80 hours |
|---|---|---|---|
| Control |  | 49.0 | 36.8 |
| 0.5% methylenebis(4-cyclohexyl isocyanate) | a. $H_2CCl_2$ | 9.1 | 22.5 |
|  | b. Toluene | 7.3 | 19.6 |
|  | c. $HCCl_3$ | 9.2 | 24.5 |

EXAMPLE IV

The prepolymer of Example I was mixed with 1 percent (on the weight of the prepolymer) of methylenebis(4-cyclohexylisocyanate) and then emulsified in water as described in Example II.

Table 2

|  | Gas Fade Test 32 hours | Fade-Ometer 80 hours |
|---|---|---|
| Control | 49.0 | 36.8 |
| 1% methylenebis(4-cyclohexylisocyanate) | 7.3 | 20.8 |

EXAMPLE V

Following the procedure of Example IV, cyclohexylisocyanate was incorporated into the polymer in the following amounts and with the following results:

Table 3

|  | Gas Fade Test 32 hours | Fade-Ometer 80 hous |
|---|---|---|
| Control | 49.0 | 36.8 |
| 1% cyclohexylisocyanate | 12.0 | 25.5 |
| 0.5% cyclohexylisocyanate | 26.2 | 25.4 |
| 0.2% cyclohexylisocyanate | 36.1 | 27.8 |
| 0.1% cyclohexylisocyanate | 49.0 | 29.8 |

This example illustrates the considerable improvement in color resulting from the addition of cyclohexylisocyanate, especially that caused by acid fumes. It also illustrates the concentration dependence of the improvement.

EXAMPLE VI

An emulsion was prepared in accordance with the procedure of Example II except that the solids content was 50 percent. In addition, the prepolymer contained 0.15 percent of 2-(2-hydroxy-3,5-di-t-butylphenyl)-5-chlorobenzotriazole and 0.1 percent 2,6-di-t-butyl-p-cresol. A sample of the emulsion described was treated with 1 percent (on the solid content) of n-butyl isocyanate dissoled in an equal weight of toluene. This was stirred in for 18 hours at room temperature. Films (15–20 mils) were cast and exposed as described hereinabove with the following results.

Table 4

|  | Gas Fade Test 32 hours | Fade-Ometer 80 hours |
|---|---|---|
| Control | 35.9 | 19.7 |
| 1% n-butyl isocyanate | 10.0 | 11.4 |

This example illustrates the improvement resulting from the addition of the combination of ultraviolet absorber and antioxidant (35.9 and 19.7 vs. 49.0 and 36.8) and the considerable further improvement in color resulting from the addition of 1 percent of n-butyl isocyanate. When the procedure of Example VI was followed except for the substitution of 1 percent cyclohexyl isocyanate for 1 percent n-butyl isocyanate, the results were as follows:

Table 5

| Gas Fade Test - 32 hours | 14.0 |
|---|---|
| Fade-Ometer - 80 hours | 15.0 |

EXAMPLE VII

A series of experiments was conducted the results of which are shown in the table below. To the emulsion of Example II was added an ultraviolet absorber: 2-(2-hydroxy-3,5-di-t.butylphenyl)-5-chlorobenzotriazole, as a 10 percent solution in chloroform, and an antioxidant: 2,6-di-t-butyl-p-cresol, as a 10 percent solution in chloroform. These were then stirred into the emulsion for 3 hours. Methylenebis(4-cyclohexylisocyanate) was then added as a 20 percent solution in chloroform and stirred for 24 hours.

Table 6

| Exp. | UV Absorber | Antioxidant | Isocyanate | Gas Fade Test 32 hours | Fade-Ometer 80 hours |
|---|---|---|---|---|---|
| 1 | 0 | 0 | 0 | 49.0 | 36.8 |
| 2 | 0.15% | 0 | 0.1% | 33.8 | 17.0 |
| 3 | 0.15 | 0 | 0.25 | 13.0 | 15.2 |
| 4 | 0.15 | 0 | 0.5 | 8.5 | 15.1 |
| 5 | 0.15 | 0.1% | 0.5 | 10.2 | 16.5 |
| 6 | 0.15 | 0 | 0.75 | 6.2 | 14.4 |
| 7 | 0.15 | 0 | 1.0 | 6.8 | 12.8 |

Comparison of these data with Example III illustrates that a further improvement in the Fade-Ometer Test is obtained by the addition of an ultraviolet absorber (Exp. 4-15.1 vs. 24.5), but no improvement is observed in the Gas Fade Test by the addition of an antioxidant (Exp. 4-15.1 vs. Ex. III-24.5), but no improvement is observed in the Gas Fado Test by the addition of an antioxidant (Ex. III-9.2). Thus 2,6-di-t.butyl-p-cresoi in this case has very little effect.

We claim:

1. A polyurethane polymer stabilized against the deteriorative effects of ultraviolet light and nitrogen oxides, which comprises a polyurethane polymer and a stabilizing amount of an aliphatic isocyanate selected from the group consisting of alkylisocyanates, alkylenediisocyanates, cycloalkylisocyanates and cycloalkylenediisocyanates, said polyurethane polymer comprising an isocyanate terminated prepolymer obtained by reacting a polyether or a polyester with an excess of an aromatic diisocyanate, forming an emulsion thereof and subsequently chain-extending the prepolymer with water.

2. The polymer according to claim 1 wherein the isocyanate is methylenebis(4-cyclohexyl isocyanate).

3. The polymer according to claim 1 wherein the isocyanate is cyclohexyl isocyanate.

4. The polymer according to claim 1 wherein the isocyanate is butyl isocyanate.

5. The polymer according to claim 1 wherein the polyurethane is polyether based.

6. The polymer according to claim 5 wherein the polyether is polypropylene glycol.

7. The polymer according to claim 1 wherein the polyurethane is polyester based.

8. A process for stabilizing a polyurethane polymer from the deteriorative effects of ultraviolet light and nitrogen oxides which consists of forming an isocyanate-terminated polyurethane prepolymer by reacting a polyester or polyether polyol with an excess of an aromatic diisocyanate, forming an emulsion of the resultant prepolymer, chain-extending said prepolymer and adding to said prepolymer, before or during said emulsion forming, a stabilizing amount of an aliphatic isocyanate selected from the group consisting of alkylisocyanates, cycloalkylisocyanates, alkylenediisocyanates and cycloalkylenediisocyanates.

9. The process according to claim 8 wherein the prepolymer is emulsified and the aliphatic or cycloaliphatic monoisocyanate or diisocyanate is added to the emulsion.

10. The process according to claim 9 wherein the amount of isocyanate is from 0.1 to 5 percent by weight of the solids of the emulsion.

11. The process according to claim 10 wherein the amount of isocyanate is from about 0.5 to 2 percent.

* * * * *